(12) United States Patent
Sun et al.

(10) Patent No.: US 11,329,104 B2
(45) Date of Patent: May 10, 2022

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Liang Sun, Hubei (CN); Mian Zeng, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 303 days.

(21) Appl. No.: 16/496,630

(22) PCT Filed: Jul. 12, 2019

(86) PCT No.: PCT/CN2019/095820
§ 371 (c)(1),
(2) Date: Sep. 23, 2019

(87) PCT Pub. No.: WO2020/191953
PCT Pub. Date: Oct. 1, 2020

(65) Prior Publication Data
US 2021/0359006 A1    Nov. 18, 2021

(30) Foreign Application Priority Data

Mar. 27, 2019 (CN) .......................... 201910235485.5

(51) Int. Cl.
*H01L 27/32* (2006.01)

(52) U.S. Cl.
CPC .......... *H01L 27/322* (2013.01); *H01L 27/323* (2013.01); *H01L 27/3218* (2013.01); *H01L 2251/5338* (2013.01)

(58) Field of Classification Search
CPC . H01L 27/322; H01L 27/323; H01L 27/3218; H01L 2251/5338
See application file for complete search history.

(56) References Cited

U.S. PATENT DOCUMENTS

| | | | |
|---|---|---|---|
| 10,249,692 B2 * | 4/2019 | Lee | ............... H01L 27/3246 |
| 2015/0318447 A1 | 11/2015 | Choi | |
| 2016/0043336 A1 * | 2/2016 | Kim | ............... H01L 51/003 257/40 |
| 2016/0124557 A1 | 5/2016 | Choi | |
| 2019/0206945 A1 | 7/2019 | Lin et al. | |

FOREIGN PATENT DOCUMENTS

| | | |
|---|---|---|
| CN | 108493211 A | 9/2018 |
| CN | 109119453 A | 1/2019 |

* cited by examiner

*Primary Examiner* — David Vu

(57) ABSTRACT

A display panel and a display device are provided. The display panel includes a substrate layer, a light emitting layer, a package layer, a filter layer and an organic flat layer. The organic flat layer covers the filter layer. The light emitting layer further includes a pixel area and a pixel interval area. The filter layer further includes an R/G/B filter area and a layer stacked area. The layer stacked area is a stacked structure of R/G/B three-layer filter layers. The layer stacked structure can thin the thickness of the display panel and improve the flexibility of the display panel.

17 Claims, 3 Drawing Sheets

DISPLAY PANEL AND DISPLAY DEVICE

BACKGROUND OF THE INVENTION

1. Field of the Invention

The present disclosure relates to a display technical field, and more particularly to a display panel and a display device.

2. Description of the Prior Art

Compared with a liquid crystal display device, an organic light-emitting device (OLED) has the advantages of self-luminescence, fast response and light weight. It is considered as the next generation of a mainstream display technology, and especially because of its flexibility, OLED display devices are the first choice for flexible display.

The OLED display device is a sandwich structure consisting of an anode, an emitting layer (EML) and a cathode, and includes a metal layer. Large amounts of metal on the surface of the OLED display device have higher reflectivity to ambient lights. But reflected lights will affect the display effect of the OLED display device. In the existing technology, the OLED display device commonly disposes a circular polarizer on one side of a light-exiting surface thereof for reducing reflection. For example, the ambient light, which is incident on the light-exiting surface of the OLED display device, passes through the circular polarizer and then is transformed into a left (or right) rotation circular polarized light. Next, the left (or right) rotation circular polarized light is reflected by the metal layer of the OLED display device to be a right (left) rotation circular polarized light. Because the right (left) rotation circular polarized light can not pass through the circular polarizer, so that reducing the reflection of the ambient light on the OLED display device. But, because of the large thickness of the circular polarizer itself, the thickness of the whole OLED display device is thicker and the elastic modulus is larger. The display device has a strong brittleness, which is not conducive to the flexibility and flexibility of the flexible OLED display device.

Hence, it is necessary to provide a solution to the problems in the existing technology.

BRIEF SUMMARY OF THE INVENTION

Technical Problem

In summary, in the existing flexible OLED display device, the thickness of the device is thicker, the elastic modulus is larger and the brittleness is stronger, which is not conducive to the flexure of the flexible OLED display device.

Technical Solutions

In order to resolve above problems, the present disclosure provides a display panel and a display device to resolve the problems of larger thickness of the circular polarizer, thicker thickness of the whole device, bigger elastic modulus, strong brittleness, and poor bending and folding performance of the OLED display device, existed in the prior flexible OLED display device.

In order to resolve above technical problems, embodiments of the present disclosure provide the following technical schemes.

According to a first aspect of the embodiment of the present disclosure, a display panel is provided and includes:

a substrate layer, a light emitting layer disposed on the substrate layer, a package layer disposed on the light emitting layer, a filter layer disposed on the package layer, an organic flat layer disposed on the filter layer, and a touch layer;

wherein, the light emitting layer includes a pixel area and a pixel interval area, which are alternately arranged;

the filter layer includes a first filter area and a second filter area, which are alternately arranged;

the second filter area includes a first color resistor, a second color resistor and a third color resistor, which are stacked to form a layer stacked structure; and the touch layer is disposed between the package layer and the filter layer.

According one embodiment of the present disclosure, the first filter area includes the first color resistor, the second color resistor and the third color resistor, which are arranged in array.

According one embodiment of the present disclosure, the first color resistor, the second color resistor and the third color resistor are one of a red color resistor, a blue color resistor and a green color resistor respectively; and the first, second and third color resistors have different colors.

According one embodiment of the present disclosure, the color resistors are made of resin material.

According one embodiment of the present disclosure, the first filter area is disposed above the pixel area of the light emitting layer, and the second filter area is disposed above the pixel interval area of the light emitting layer.

According one embodiment of the present disclosure, the touch layer further includes a touch electrode, which is disposed above the pixel interval area of the light emitting layer.

According to a second aspect of the present disclosure, a display panel is provided and includes:

a substrate layer, a light emitting layer disposed on the substrate layer, a package layer disposed on the light emitting layer, a filter layer disposed on the package layer and an organic flat layer disposed on the filter layer; the organic flat layer covering the filter layer;

wherein, the light emitting layer includes a pixel area and a pixel interval area, which are alternately arranged;

the filter layer includes a first filter area and a second filter area, which are alternately arranged;

the second filter area includes a first color resistor, a second color resistor and a third color resistor, which are stacked to form a layer stacked structure.

According one embodiment of the present disclosure, the first filter area includes the first color resistor, the second color resistor and the third color resistor, which are arranged in array.

According one embodiment of the present disclosure, the first color resistor, the second color resistor and the third color resistor are one of a red color resistor, a blue color resistor and a green color resistor respectively; and the first, second and third color resistors have different colors.

According one embodiment of the present disclosure, the color resistors are made of resin material.

According one embodiment of the present disclosure, the first filter area is disposed above the pixel area of the light emitting layer, and the second filter area is disposed above the pixel interval area of the light emitting layer.

According one embodiment of the present disclosure, the display panel further includes a touch layer, which is disposed between the package layer and the filter layer.

According one embodiment of the present disclosure, the touch layer includes a touch electrode, which is disposed above the pixel interval area of the light emitting layer.

According to another aspect of the present disclosure, a display device is provided and includes:

a substrate layer, a light emitting layer disposed on the substrate layer, a package layer disposed on the light emitting layer, a filter layer disposed on the package layer and an organic flat layer disposed on the filter layer; the organic flat layer covering the filter layer;

wherein, the light emitting layer includes a pixel area and a pixel interval area, which are alternately arranged;

the filter layer includes a first filter area and a second filter area, which are alternately arranged;

the second filter area includes a first color resistor, a second color resistor and a third color resistor, which are stacked to form a layer stacked structure.

According one embodiment of the present disclosure, the first filter area includes the first color resistor, the second color resistor and the third color resistor, which are arranged in array.

According one embodiment of the present disclosure, the first color resistor, the second color resistor and the third color resistor are one of a red color resistor, a blue color resistor and a green color resistor respectively; and the first, second and third color resistors have different colors.

According one embodiment of the present disclosure, the color resistors are made of resin material.

According one embodiment of the present disclosure, the first filter area is disposed above the pixel area of the light emitting layer, and the second filter area is disposed above the pixel interval area of the light emitting layer.

According one embodiment of the present disclosure, the display panel further includes a touch layer, which is disposed between the package layer and the filter layer.

According one embodiment of the present disclosure, the touch layer includes a touch electrode, which is disposed above the pixel interval area of the light emitting layer.

Beneficial Effect

In summary, the beneficial effects of the embodiment of the present disclosure are as follows.

The present disclosure provides a new display panel and a new display device. The filter layer is disposed on a light-exiting side of an electroluminescent display unit. The filter layer includes a plurality of filter films that allow different color lights to pass through. Moreover, a R/G/B three-color-resistor stacked structure is disposed above the interval area of the electroluminescent display unit, thereby shielding the light coming into this area and reducing the reflection of this area to the external environment light. Therefore, the present disclosure does not need to provide a circular polarizer in the display panel to reduce the reflection, thus thinning the thickness of the display panel and improving the bend-ability of the display panel.

DETAILED DESCRIPTION OF THE PREFERRED EMBODIMENTS

The following embodiments are illustrated with reference to the accompanying drawings to illustrate specific embodiments that this disclosure can be used for implementation.

Figure 1:
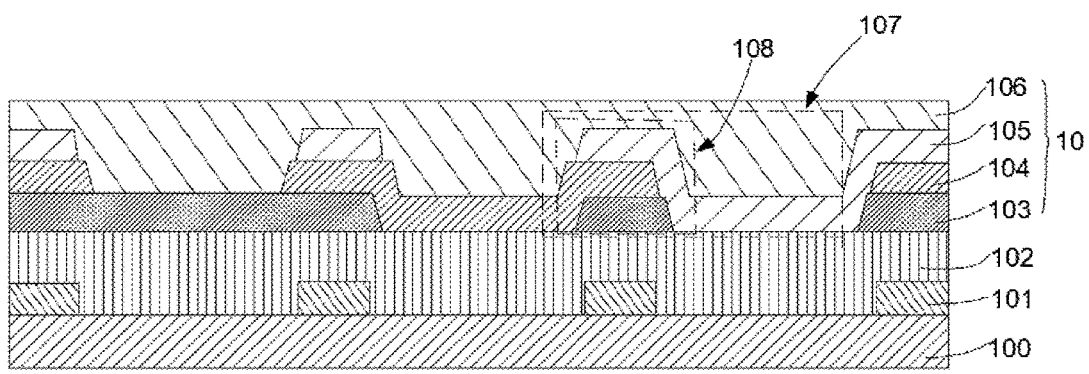
FIG. 1 is a structure schematic view of a layer stacked structure of a display panel of one embodiment of the present disclosure.

In one embodiment of the present disclosure, referring to FIG. 1, FIG. 1 is a structure schematic view of a layer stacked structure of a display panel of the embodiment of the present disclosure. In order to avoid the problems of thicker thickness, poor bending and folding performance of the prior whole device, the present disclosure provides a multilayer stacked structure design scheme of a flexible display device. The multilayer stacked structure of the display panel includes a substrate layer 100, a light emitting layer 101 disposed on the substrate layer 100, a package layer 102 covering the whole light emitting layer 101 and a filter layer 10 located above the package layer. The light emitting layer 101 includes a pixel area and a pixel interval area, which are alternately arranged. The pixel area is provided with R, G or B pixel units. An external light can enter into the display panel through the pixel area. The pixel interval area is mainly a pixel define layer (PDL) and the PDL is provided with a plurality of spacers (SP). The pixel area and the pixel interval area are fabricated by lithography processes such as exposure, development, etching and peeling.

Moreover, in the embodiment of the present disclosure, the filter layer 10 is used to reduce the thickness of the display panel. Wherein, the filter layer 10 includes a first filter area 107 and a second filter area 108, which are provided with different color resistors. Specifically, the filter layer 10 includes a first color resistor 103, a second color resistor 104, a third color resistor 105 and an organic flat layer 106. Wherein, the second filter area 108 consists of the first color resistor 103, the second color resistor 104 and the third color resistor 105, which are stacked to form a multi-color-resistor layer stacked structure. The first filter area also includes the first color resistor, the second color resistor and the third color resistor, which are partially disposed in the second filter area and are arranged in array. The first color resistor 103, the second color resistor 104 and the third color resistor 105 are one of a red (R) color resistor, a blue (B) color resistor and a green (G) color resistor respectively, and the first color resistor 103, the second color resistor 104 and the third color resistor 105 have different colors. The material of the color resistors can be a resin material. When the first filter area 107 is set, the first filter area 107 is disposed above the pixel area of the light emitting layer 101, and the second filter area 108 is disposed above the pixel interval area of the light emitting layer 101. The thickness of the color resistor in the first filter area 107 is less than that of the color resistor in the second filter area 108. Thus, lights can pass through the pixel area and cannot be blocked by the PDL layer. The three-color-resistor layer stacked structure can effectively block the natural light coming into the area, and also reduce the reflection of the external environment light in the area.

Wherein, in the embodiment of the present disclosure, the package layer 102 further includes a first inorganic insulating layer, an organic layer and a second inorganic insulating layer, which are arranged in turn.

Figure 2:
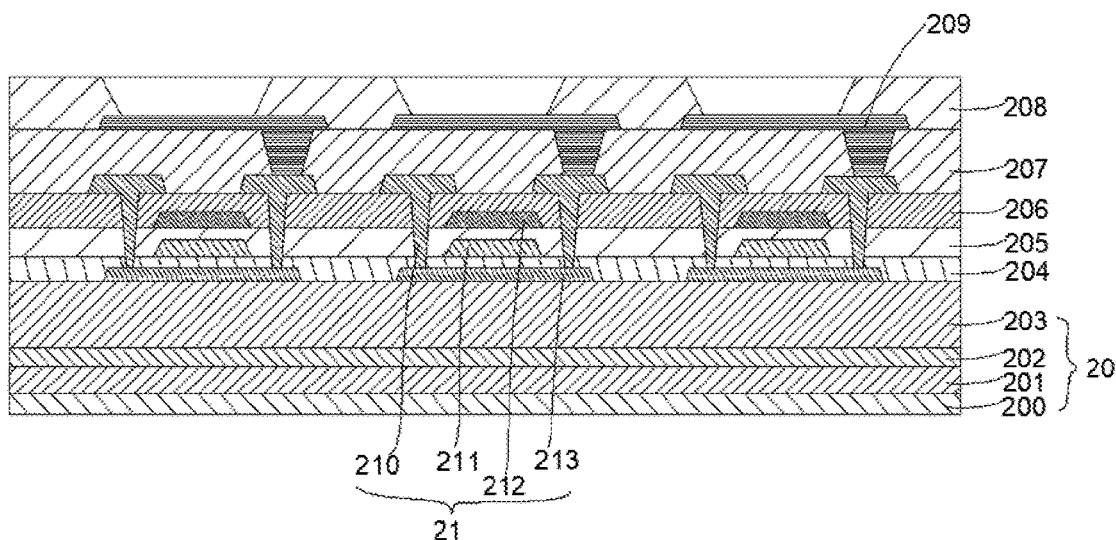
FIG. 2 is a cross-sectional schematic view of the substrate layer in the embodiment of the present disclosure.

Specifically, referring to FIG. 2, FIG. 2 is a cross-sectional schematic view of the substrate layer in the embodiment of the present disclosure. Combined with the schematic structure of FIG. 1, in the embodiment of the present disclosure, the substrate layer 20 is a double-layer flexible substrate structure, which enhances the performance of the substrate layer. The material of the substrate layer may be polyimide (PI). When making the double-layer substrate structure, a PI substrate 200 is provided first; then a buffer layer 201 is disposed on the PI substrate 200, wherein the buffer layer 201 is made of an inorganic insulating layer material; next a second PI substrate 202 is disposed on the buffer layer; and final a second buffer layer 203 is disposed on the PI substrate 202. The substrate layer further includes a first gate insulation layer 204, a second gate insulation layer 205 disposed on the first gate insulation layer 204, an inter layer dielectric (ILD) 206 disposed on the second gate insulation layer 205, a planarization layer (PLN) 207 disposed on the inter layer dielectric 206, a pixel definition layer 208 disposed on the planarization layer 207, and an anode layer 209 disposed between the pixel definition layer 208 and the planarization layer 207. The structures of the above layers are fabricated by lithography processes such as exposure, development, etching and peeling.

In the embodiment, the substrate layer 20 may be an LTPS (Low Temperature Poly-Silicone) substrate, an IGZO (Indium Gallium Zinc Oxide) substrate, or a TFT (Thin Film Transistor) substrate.

Moreover, the display panel of the present disclosure further includes a function layer 21. Specifically, the function layer 21 includes at least one source/drain electrode layer 210, at least one first gate electrode layer 211, at least one second gate electrode layer 212, at least one semiconductor layer 213 and at least one through hole. The source/drain electrode layer 210 is disposed in the through hole and is connected with the semiconductor layer 213 by the through hole. Wherein, the through hole passes through the inter layer dielectric 206, the second gate insulation layer 205 and the first gate insulation layer 204 in turn. The first gate electrode layer 211 is disposed between the first gate insulation layer 204 and the second gate insulation layer 205. The second gate electrode layer 212 is disposed between the second gate insulation layer 205 and the inter layer dielectric 206.

Figure 3:
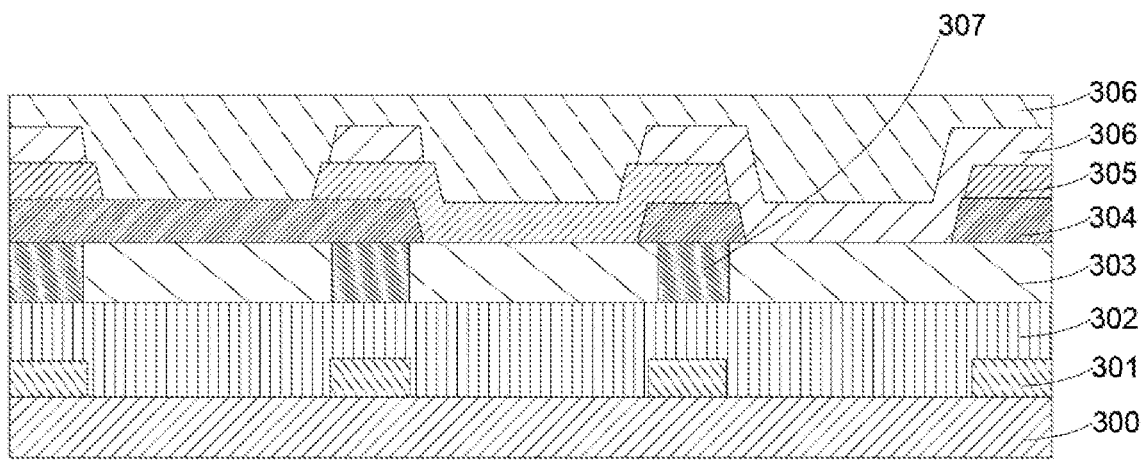
FIG. 3 is a structure schematic view of the display panel embedded with touch function.

Referring to FIG. 3, FIG. 3 is a structure schematic view of the display panel embedded with touch function. The display panel of one embodiment of the present disclosure includes a substrate layer 300, a light emitting layer 301 disposed on the substrate layer 300, a package layer 302 disposed on the light emitting layer 301, a touch layer 303 disposed on the package layer 302 and a filter layer disposed on the touch layer 303. Specifically, the touch layer includes a touch electrode 307, which is disposed above the pixel interval area of the light emitting layer 301, the top of the touch electrode 307 corresponds to the stacked structure of R/G/B three-layer filter layer.

In order to achieve better touch effect, the touch electrode further includes at least one first touch electrode, at least one insulation layer and at least one second touch electrode. The insulation layer separates the first touch electrode and the second touch electrode. The first touch electrode and the second touch electrode are used to receive touch signal and transmit the signal. In preparation, after providing the touch layer 303, the filter layer and the organic flat layer on the touch layer 303 are prepared in turn. Each layer is fabricated by lithography processes such as exposure, development, etching and peeling.

Figure 4:
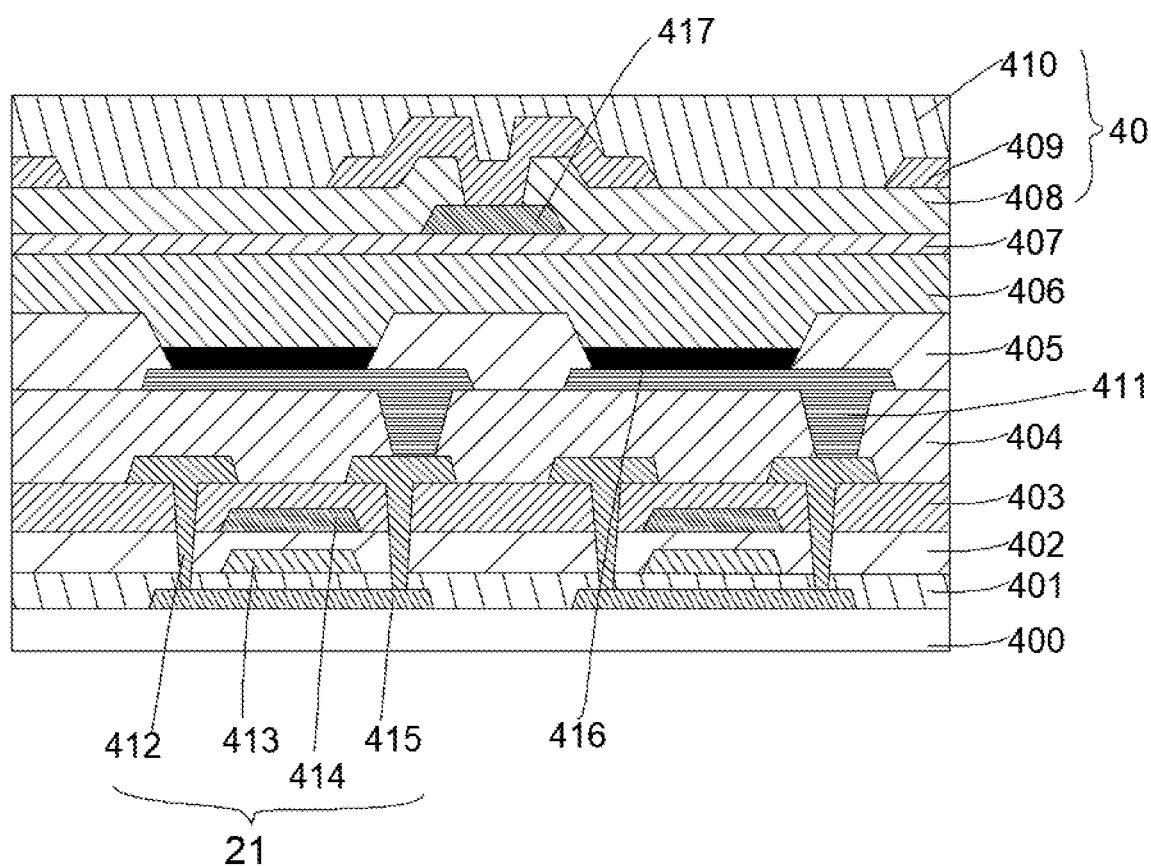
FIG. 4 is a cross-sectional schematic view of each layer embedded with touch portion in the embodiment of the present disclosure.

Specifically, referring to FIG. 4, FIG. 4 is a cross-sectional schematic view of each layer embedded with touch portion in the embodiment of the present disclosure. Please combine FIG. 2 and FIG. 3, in the embodiment of the present disclosure, the structures of the substrate layer, the light emitting layer and the package layer are same as those in FIGS. 2 and 3. The display panel includes a touch layer 40. Wherein, the touch layer 40 includes a first touch passivation layer 407, a first touch electrode 417, a second touch passivation layer 408, a second touch electrode 409 and a protection layer 410. The first touch electrode 417 is disposed between the first touch passivation layer 407 and the second touch passivation layer 408. The second touch electrode 409 is disposed between the second touch passivation layer 408 and the protection layer 410. Wherein, the second touch electrode has a hole bridge structure to enhance touch sensing ability.

In the embodiment of the present disclosure, a new filter layer is provided. The filter layer includes a plurality of filter units that allow different color lights to pass through. By the filter units, the natural light incident from a light-exiting side enters the inner of the display panel through the filter layer first, but the filter layer can filter out most of the light and can only allow a single color light to pass through. Therefore, only a small part of the light enters the display panel and loses part of the light intensity when it is reflected by the metal material inside the display panel and the micro-cavity of electroluminescent units. Then, the reflected light is emitted through the filter layer, and it will be filtered again by the filter layer, so that further reducing the intensity of the reflected light and making the intensity of the reflected light very small. Moreover, in the embodiment of the present disclosure, the R/G/B three-color-resistor layer stacked structure can effectively shield the light coming into this area and reduce the reflection of this area to the external environment light. Therefore, the present disclosure does not need to provide a circular polarizer in the display panel to reduce the reflection, thus thinning the thickness of the display panel, improving the flexibility and the bend-ability of the display panel, and realizing the folding function.

Figure 5:
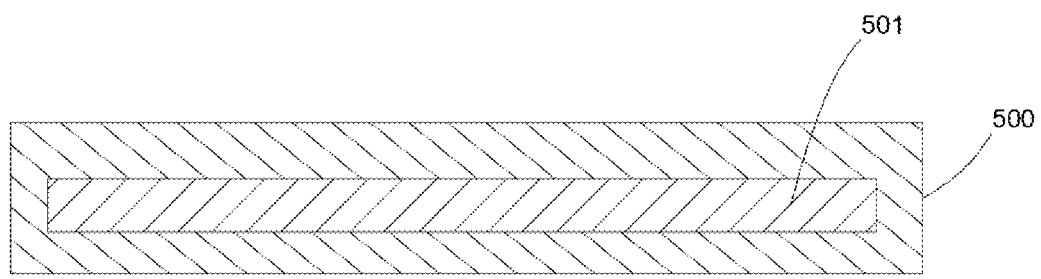
FIG. 5 is a schematic view of a display device of one embodiment of the present disclosure.

The embodiment of the present disclosure further provides a display device, as shown in FIG. 5. The display device 500 includes a display panel 501 provided in this disclosure.

The above is a detailed description of an air intake device and an air intake equipment provided in the embodiment of the present disclosure. The description of the above embodiments is only intended to help understand the technical solutions and their core ideas disclosed herein. Those skilled in the art should understand that they can still modify the technical solutions recorded in the aforementioned embodiments, and these modifications or substitutions do not divert the nature of the corresponding technical solutions from the scope of the technical solutions of the embodiments disclosed herein.

What is claimed is:
1. A display panel, including:
a substrate layer, a light emitting layer disposed on the substrate layer, a package layer disposed on the light emitting layer, a filter layer disposed on the package layer, an organic flat layer disposed on the filter layer, and a touch layer;
wherein, the light emitting layer includes a pixel area and a pixel interval area, which are alternately arranged;
the filter layer including a first filter area and a second filter area, which are alternately arranged;
the second filter area including a first color resistor, a second color resistor and a third color resistor, which are stacked to form a layer stacked structure; and the touch layer being disposed between the package layer and the filter layer.

2. The display panel as claimed in claim 1, wherein the first filter area includes the first color resistor, the second color resistor and the third color resistor, which are arranged in array.

3. The display panel as claimed in claim 1, wherein the first color resistor, the second color resistor and the third color resistor are one of a red color resistor, a blue color resistor and a green color resistor respectively; and the first, second and third color resistors have different colors.

4. The display panel as claimed in claim 1, wherein the color resistors are made of resin material.

5. The display panel as claimed in claim 1, wherein the first filter area is disposed above the pixel area of the light emitting layer, and the second filter area is disposed above the pixel interval area of the light emitting layer.

6. The display panel as claimed in claim 1, wherein the touch layer further includes a touch electrode, which is disposed above the pixel interval area of the light emitting layer.

7. A display panel, including:
a substrate layer, a light emitting layer disposed on the substrate layer, a package layer disposed on the light emitting layer, a filter layer disposed on the package layer and an organic flat layer disposed on the filter layer; the organic flat layer covering the filter layer;
wherein, the light emitting layer includes a pixel area and a pixel interval area, which are alternately arranged;
the filter layer including a first filter area and a second filter area, which are alternately arranged;
the second filter area including a first color resistor, a second color resistor and a third color resistor, which are stacked to form a layer stacked structure,
wherein the display panel further includes a touch layer, which is disposed between the package layer and the filter layer,
wherein the touch layer includes a touch electrode, which is disposed above the pixel interval area of the light emitting layer.

8. The display panel as claimed in claim 7, wherein the first filter area includes the first color resistor, the second color resistor and the third color resistor, which are arranged in array.

9. The display panel as claimed in claim 7, wherein the first color resistor, the second color resistor and the third color resistor are one of a red color resistor, a blue color resistor and a green color resistor respectively; and the first, second and third color resistors have different colors.

10. The display panel as claimed in claim 7, wherein the color resistors are made of resin material.

11. The display panel as claimed in claim 7, wherein the first filter area is disposed above the pixel area of the light emitting layer, and the second filter area is disposed above the pixel interval area of the light emitting layer.

12. A display device, including:
a substrate layer, a light emitting layer disposed on the substrate layer, a package layer disposed on the light emitting layer, a filter layer disposed on the package layer and an organic flat layer disposed on the filter layer; the organic flat layer covering the filter layer;
wherein, the light emitting layer includes a pixel area and a pixel interval area, which are alternately arranged;
the filter layer including a first filter area and a second filter area, which are alternately arranged;
the second filter area including a first color resistor, a second color resistor and a third color resistor, which are stacked to form a layer stacked structure,
wherein the display panel further includes a touch layer, which is disposed between the package layer and the filter layer.

13. The display device as claimed in claim 12, wherein the first filter area includes the first color resistor, the second color resistor and the third color resistor, which are arranged in array.

14. The display device as claimed in claim 12, wherein the first color resistor, the second color resistor and the third color resistor are one of a red color resistor, a blue color resistor and a green color resistor respectively; and the first, second and third color resistors have different colors.

15. The display device as claimed in claim 12, wherein the color resistors are made of resin material.

16. The display device as claimed in claim 12, wherein the first filter area is disposed above the pixel area of the light emitting layer, and the second filter area is disposed above the pixel interval area of the light emitting layer.

17. The display device as claimed in claim 12, wherein the touch layer includes a touch electrode, which is disposed above the pixel interval area of the light emitting layer.

* * * * *